(12) United States Patent
Maekawa et al.

(10) Patent No.: US 10,454,413 B2
(45) Date of Patent: Oct. 22, 2019

(54) SOLAR CELL MODULE

(71) Applicant: Panasonic Intellectual Property Management Co., Ltd., Osaka (JP)

(72) Inventors: Akimichi Maekawa, Osaka (JP); Junpei Irikawa, Osaka (JP); Tasuku Ishiguro, Osaka (JP); Haruhisa Hashimoto, Osaka (JP); Hiroshi Kanno, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 15/067,181

(22) Filed: Mar. 11, 2016

(65) Prior Publication Data

US 2016/0268964 A1    Sep. 15, 2016

(30) Foreign Application Priority Data

Mar. 13, 2015 (JP) ................................. 2015-050882

(51) Int. Cl.
| | |
|---|---|
| *H02S 40/22* | (2014.01) |
| *H01L 31/048* | (2014.01) |
| *H01L 31/056* | (2014.01) |
| *H01L 31/054* | (2014.01) |
| *H01L 31/05* | (2014.01) |

(52) U.S. Cl.
CPC .......... *H02S 40/22* (2014.12); *H01L 31/0488* (2013.01); *H01L 31/056* (2014.12); *H01L 31/0547* (2014.12); *B32B 2457/12* (2013.01); *H01L 31/0516* (2013.01); *Y02E 10/52* (2013.01)

(58) Field of Classification Search
CPC ............. H01L 31/0488; H01L 31/0201; H01L 31/048; H01L 31/0508; H01L 31/0516; H01L 31/054; H01L 31/0547; H01L 31/0543; H01L 31/0481; H01L 31/056; H02S 40/22; B32B 2457/12; B32B 2307/416
USPC .................................................. 136/243–265
See application file for complete search history.

(56) References Cited

U.S. PATENT DOCUMENTS

| | | | | |
|---|---|---|---|---|
| 4,235,643 | A | * 11/1980 | Amick | .................. H01L 31/048 136/246 |
| 5,288,337 | A | * 2/1994 | Mitchell | ................. H02S 40/22 136/244 |
| 5,994,641 | A | 11/1999 | Kardauskas | |
| 6,008,449 | A | * 12/1999 | Cole | ..................... H01L 31/048 136/246 |

(Continued)

FOREIGN PATENT DOCUMENTS

| | | |
|---|---|---|
| CN | 102969384 A | 3/2013 |
| JP | 2012-49390 A | 3/2012 |

(Continued)

OTHER PUBLICATIONS

English machine translation of CN 102969384 (Year: 2013).*

(Continued)

*Primary Examiner* — Andrew J Golden
(74) *Attorney, Agent, or Firm* — Metrolex IP Law Group, PLLC

(57) ABSTRACT

A solar cell module includes a first solar cell, a second solar cell disposed with a gap from the first solar cell, and a light reflection sheet bridging between the first solar cell and the second solar cell across the gap. The light reflection sheet is at least partially bent between the first and second solar cells.

23 Claims, 10 Drawing Sheets

(56) References Cited

U.S. PATENT DOCUMENTS

| | | | |
|---|---|---|---|
| 6,323,415 B1* | 11/2001 | Uematsu | H01L 31/048 136/246 |
| 9,252,299 B2 | 2/2016 | Ide et al. | |
| 2005/0016580 A1* | 1/2005 | Haga | H01L 31/048 136/244 |
| 2006/0107991 A1* | 5/2006 | Baba | H01L 31/0547 136/244 |
| 2009/0032087 A1* | 2/2009 | Kalejs | H01L 31/0516 136/246 |
| 2011/0277817 A1 | 11/2011 | Ide et al. | |
| 2013/0206210 A1 | 8/2013 | Niinobe et al. | |
| 2013/0298965 A1* | 11/2013 | Liu | H01L 31/042 136/246 |
| 2014/0209151 A1* | 7/2014 | Kim | H01L 31/048 136/251 |
| 2014/0373903 A1 | 12/2014 | Hashimoto et al. | |

FOREIGN PATENT DOCUMENTS

| | | | | |
|---|---|---|---|---|
| JP | 2013-98496 A | 5/2013 | | |
| JP | 2014-72276 A | 4/2014 | | |
| WO | 99/09601 A1 | 2/1999 | | |
| WO | 2010/021204 A1 | 2/2010 | | |
| WO | WO-2012114918 A1 * | 8/2012 | | H01L 31/0481 |
| WO | 2013/137204 A1 | 9/2013 | | |

OTHER PUBLICATIONS

WO 2012114918A1 English machine translation (Year: 2012).*
Extended European Search Report dated Jul. 20, 2016 for the counterpart European Application No. 16159840.4.

* cited by examiner

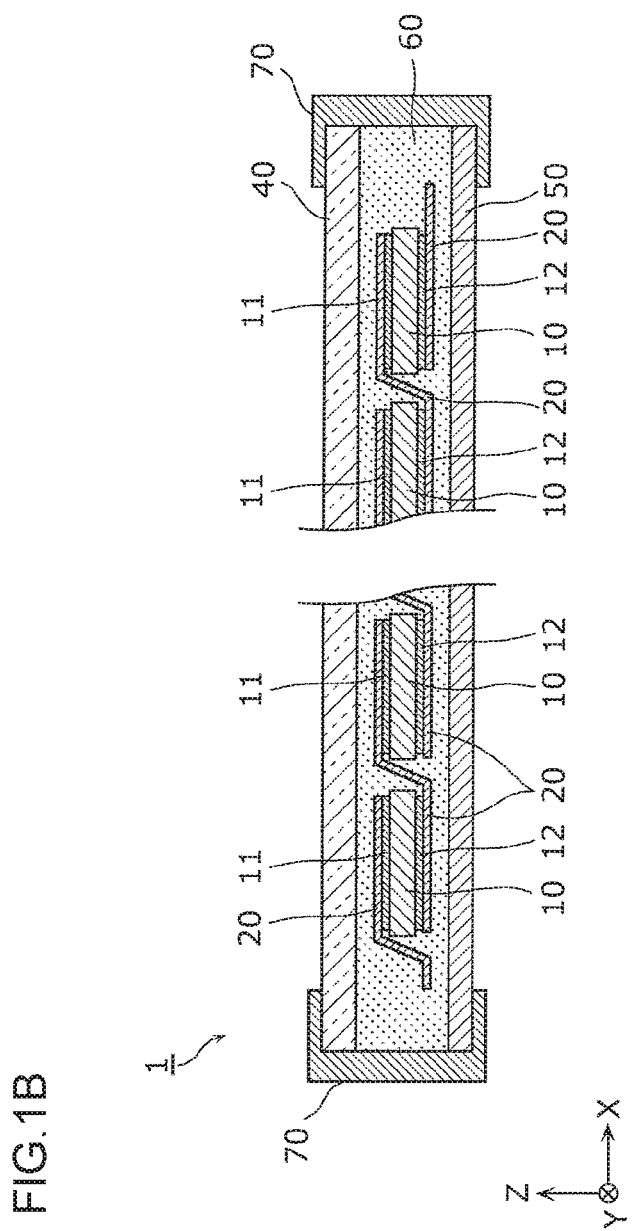

SOLAR CELL MODULE

CROSS REFERENCE TO RELATED APPLICATIONS

This application claims priority from prior Japanese Patent Application No. 2015-050882 filed on Mar. 13, 2015, entitled "SOLAR CELL MODULE", the entire contents of which are incorporated herein by reference.

BACKGROUND OF THE INVENTION

1. Field of the Invention

This disclosure relates to a solar cell module.

2. Description of the Related Art

There has heretofore been advanced the development of solar cell modules as a photoelectric converter to convert light energy into electric energy. The solar cell module can convert inexhaustible sunlight directly into electric power, and is environment-friendly and clean compared with power generation with a fossil fuel. Thus, the solar cell module has been considered promising as a new energy source.

The solar cell module has a structure in which solar cells are sealed by a bonding member between a front protective member and a back protective member, for example. In the solar cell module, the solar cells are arranged in a matrix pattern.

There has heretofore been proposed a solar cell module in which in order to effectively utilize sunlight irradiated onto the gap between solar cells, a light reflection member is provided in a gap between the solar cells, the light reflection member protruding from light-receiving surfaces of the solar cells and having top surfaces tilting to the light-receiving surfaces, (for example, Japanese Patent Application Publication No. 2013-98496).

SUMMARY OF THE INVENTION

It has been studied to dispose a light reflection sheet as a light reflection member so as to straddle two adjacent solar cells. For example, it has been considered to cover a gap between strings with a light reflection sheet, the strings being formed by connecting solar cells with tab wiring members.

However, when the light reflection sheet is disposed so as to straddle two adjacent solar cells, the solar cells apply tensile or compressive stress to each other through the light reflection sheet due to a temperature change. Therefore, there is a problem that the solar cells deteriorate due to damage and the like.

It is an object of an embodiment of the invention to provide a solar cell module capable of suppressing deterioration of solar cells even if a light reflection sheet straddles two adjacent solar cells.

An aspect of the invention is a solar cell module that comprises: a first solar cell; a second solar cell disposed with a gap from the first solar cell; and a light reflection sheet provided so as to straddle the first solar cell and the second solar cell across the gap, wherein a portion of the light reflection sheet corresponding to the gap is at least partially bent.

According to the aspect of the invention, even if the light reflection sheet straddles two adjacent solar cells, deterioration of the solar cells can be suppressed.

BRIEF DESCRIPTION OF THE DRAWINGS

FIG. 1B is a cross-sectional view taken along the line IB-IB in FIG. 1A, illustrating the solar cell module according to Embodiment 1.

DESCRIPTION OF THE PREFERRED EMBODIMENTS

Figure 1A:
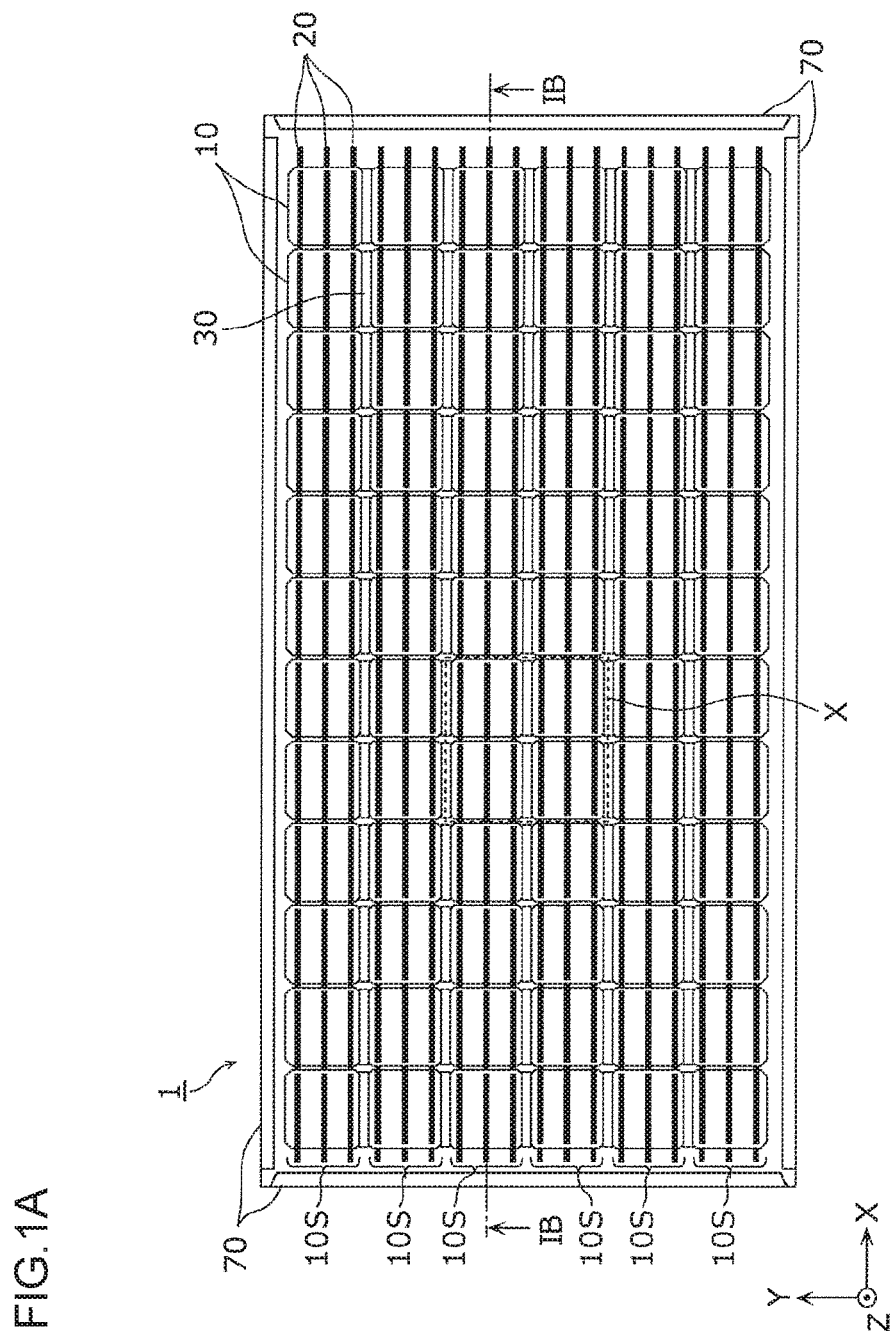
FIG. 1A is a plan view of a solar cell module according to Embodiment 1.

With reference to the drawings, embodiments of the invention are described below. The embodiments described below all represent preferred concrete examples of the invention. Therefore, numerical values, shapes, materials, constituent elements, arrangement positions and the connection configuration of the constituent elements, steps, the order of the steps, and the like described in the following embodiments are merely examples, and are not intended to limit the invention. Therefore, among the constituent elements in the following embodiments, constituent elements that are not described in independent claims that show the most superordinate concept of the invention are described as optional constituent elements.

Note that the drawings are schematic and not necessarily to scale. Also, in the drawings, substantially the same elements are denoted by the same reference numerals, and repetitive description is omitted or simplified.

Embodiment 1

[Configuration of Solar Cell Module]

First, with reference to FIGS. 1A and 1B, description is given of a schematic configuration of solar cell module 1 according to Embodiment 1. FIG. 1A is a plan view of the solar cell module according to Embodiment 1. FIG. 1B is a cross-sectional view taken along the line IB-IB in FIG. 1A, illustrating the solar cell module according to Embodiment 1.

Note that, in FIGS. 1A and 1B, the Z-axis is perpendicular to the principal surfaces of solar cell module 1, and the X-axis and Y-axis are orthogonal to each other and also are both orthogonal to the Z-axis. As for the Z-axis, X-axis and Y-axis, the same applies to the following drawings.

As illustrated in FIGS. 1A and 1B, solar cell module 1 includes solar cells 10, tab wiring members 20, light reflection sheet 30, front protective member 40, back protective member 50, bonding member 60 and frame 70. Solar cell module 1 has a structure in which solar cells 10 are sealed between front protective member 40 and back protective member 50 by bonding member 60.

As illustrated in FIG. 1A, solar cell module 1 has an approximately rectangular shape, for example, in a planar view. As an example, solar cell module 1 has an approximately rectangular shape that is about 1600 mm in width and about 800 mm in length. Note that the shape of solar cell module 1 is not limited to a rectangular shape.

Figure 2:
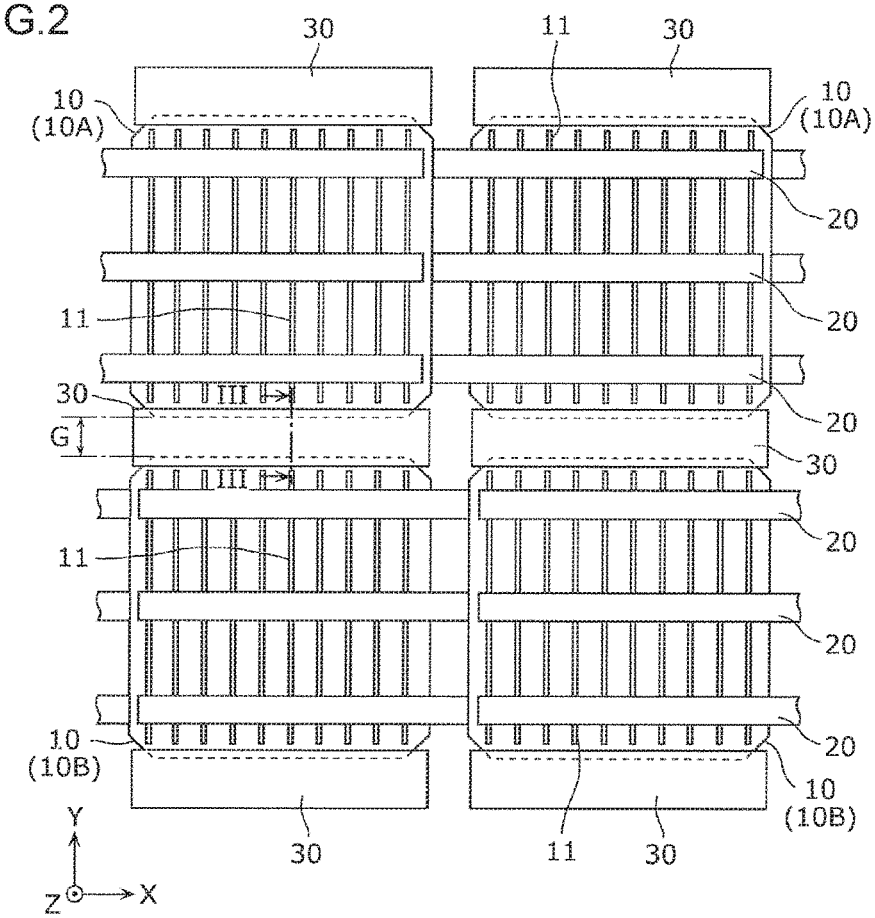
FIG. 2 is a partially enlarged plan view of the solar cell module according to Embodiment 1.
Figure 3:
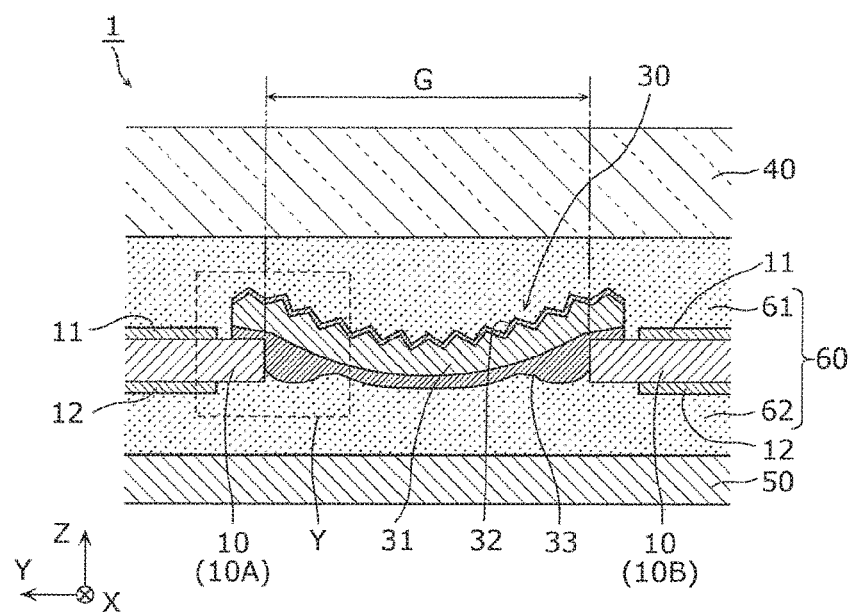
FIG. 3 is a cross-sectional view (enlarged cross-sectional view around a light reflection sheet) taken along the line III-III in FIG. 2, illustrating the solar cell module according to Embodiment 1.

The constituent members in solar cell module 1 are described in more detail with FIGS. 2 and 3 while referring to FIGS. 1A and 1B. FIG. 2 is an enlarged view of Region X surrounded by the broken line in FIG. 1A, and is a partially enlarged plan view of the solar cell module according to Embodiment 1. FIG. 3 is a cross-sectional view taken along the line in FIG. 2, illustrating the solar cell module according to Embodiment 1. Note that FIG. 3 is an enlarged cross-sectional view around light reflection sheet 30.

[Solar Cell (Solar Cell Element)]

Solar cells 10 are photoelectric conversion elements (photovoltaic elements), which convert light such as sunlight into electric power. As illustrated in FIG. 1A, solar cells 10 are arranged in a line-column pattern (matrix) in the same plane.

As for solar cells 10 linearly arranged along one of a row direction and a column direction, two solar cells 10 adjacent to each other are connected by tab wiring members 20 to form a string (cell string). Multiple solar cells 10 are electrically connected by tab wiring members 20 to form a string. Solar cells 10 in one string 10S are connected in series by tab wiring members 20.

In this embodiment, as illustrated in FIG. 1A, twelve solar cells 10 arranged equally spaced apart along the row direction (X-axis direction) are connected by tab wiring members 20 to form one string 10S. To be more specific, each string 10S is formed by sequentially connecting two solar cells 10 adjacent to each other in the row direction (X-axis direction) with three tab wiring members 20. All solar cells 10 in a line arranged along the row direction are connected.

Strings 10S are formed in multiple numbers. Strings 10S (strings) are arranged along the other one of the row direction and the column direction. In this embodiment, six strings 10S are formed. As illustrated in FIG. 1A, six strings 10S are arranged equally spaced apart along the column direction (Y-axis direction) so as to be parallel to each other.

Note that the first solar cell 10 in each string 10S is connected to an interconnection wiring member (not illustrated) through tab wiring members 20. Likewise, the last solar cell 10 in each string 10S is connected to an interconnection wiring member (not illustrated) through tab wiring members 20. Thus, more than one string 10S (six strings in FIG. 1A) is connected in series or connected in parallel to form a cell array. In this embodiment, two strings 10S adjacent to each other are connected in series to form one series connection body (twenty-four series-connected solar cells 10), and three series connection bodies are connected in parallel.

As illustrated in FIGS. 1A and 2, solar cells 10 are arranged with a gap G between solar cells 10 adjacent to each other in the row direction and column direction. As described later, light reflection sheet 30 is disposed in the gap G.

In this embodiment, solar cell 10 has an approximately rectangular shape in a planar view. To be more specific, solar cell 10 has a 125×125 mm square shape with chamfered corners. That is, one string 10S is configured such that two solar cells 10 adjacent to each other have their one sides facing each other. Note that the shape of solar cell 10 is not limited to the approximately rectangular shape.

In solar cell 10, as illustrated in FIGS. 1B and 3, front-side collector electrode 11, which is electrically connected to the front-side electrode in solar cell 10, and back-side collector electrode 12, which is electrically connected to the back-side electrode in solar cell 10, are formed.

For example, each of front-side collector electrode 11 and back-side collector electrode 12 includes: finger electrodes linearly formed so as to be orthogonal to the extending direction of tab wiring members 20; and bus bar electrodes connected to the finger electrodes and linearly formed along a direction orthogonal to the finger electrodes (the extending direction of tab wiring members 20). The number of the bus bar electrodes is the same as that of tab wiring members 20, for example, and is three in this embodiment. Note that front-side collector electrode 11 and back-side collector electrode 12 have the same shape, but the invention is not limited thereto.

Front-side collector electrode 11 and back-side collector electrode 12 are made of a low-resistance conductive material such as silver (Ag). For example, front-side collector electrode 11 and back-side collector electrode 12 can be formed by screen printing conductive paste (silver paste or the like) in a predetermined pattern, the conductive paste having a conductive filler such as silver dispersed in binder resin.

In solar cell 10 thus configured, both of the front surface and the back surface serve as light-receiving surfaces. When light enters solar cell 10, carriers are generated in a photoelectric conversion body in solar cell 10. The generated carriers are collected by front-side collector electrode 11 and back-side collector electrode 12 and then flow into tab wiring members 20. By providing front-side collector electrode 11 and back-side collector electrode 12 as described above, the carriers generated in solar cell 10 can be efficiently taken out to an external circuit.

[Tab Wiring Member]

As illustrated in FIGS. 1A and 1B, tab wiring member 20 (interconnector) electrically connects two adjacent solar cells 10 to each other in string 10S. In this embodiment, as illustrated in FIGS. 1A and 2A, two adjacent solar cells 10 are connected by three tab wiring members 20 disposed approximately parallel to each other. Tab wiring members 20 are provided so as to extend along the arrangement direction of two solar cells 10 to be connected.

Each of tab wiring members 20 is an elongated conductive wiring member, and is a ribbon-shaped metal foil, for example. Tab wiring member 20 can be fabricated, for example, by cutting a metal foil, such as a copper foil and a silver foil, with its entire surface covered with solder, silver or the like into rectangles each having a predetermined length.

As illustrated in FIG. 1B, each of tab wiring members 20 has one end thereof disposed on the front surface of one of two adjacent solar cells 10, and the other end disposed on the back surface of the other one of two adjacent solar cells 10.

In the two adjacent solar cells 10, each of tab wiring members 20 electrically connects front-side collector electrode 11 in one solar cell 10 to back-side collector electrode 12 in the other solar cell 10. For example, tab wiring member 20 and front-side collector electrode 11 (bus bar electrode) in solar cell 10 are bonded with a conductive adhesive such as a solder material.

[Light Reflection Sheet]

As illustrated in FIGS. 1A, 2 and 3, light reflection sheet 30 is provided with solar cell 10. As illustrated in FIGS. 2 and 3, light reflection sheet 30 is provided so as to straddle two adjacent solar cells 10 (first solar cell 10A and second solar cell 10B) disposed with a gap G therebetween. To be more specific, light reflection sheet 30 is provided at the edge of first solar cell 10A and the edge of second solar cell 10B so as to straddle first solar cell 10A and second solar cell 10B. That is, first solar cell 10A and second solar cell 10B, which are disposed with the gap G therebetween, are connected by light reflection sheet 30.

To be more specific, light reflection sheet 30 is provided on the front protective member 40 side (light-receiving surface side) of first solar cell 10A such that one end of light reflection sheet 30 in the width direction overlaps with the edge of first solar cell 10A on the second solar cell 10B side. Also, light reflection sheet 30 is provided on the front protective member 40 side (light-receiving surface side) of second solar cell 10B such that the other end of light reflection sheet 30 in the width direction overlaps with the edge of second solar cell 10B on the first solar cell 10A side.

That is, the light reflection sheet 30 bridges between and is attached to the light-receiving surfaces (first principle surfaces) of the first and second solar cells.

Thus, the gap G between two adjacent solar cells 10 (first solar cell 10A and second solar cell 10B) is covered with light reflection sheet 30.

Moreover, as illustrated in FIG. 1A, more than one light reflection sheet 30 is provided along a longitudinal direction of string 10S in the gap G between two adjacent strings 10S. To be more specific, in the gap G between strings 10S, light reflection sheets 30 are provided in every gap G between two solar cells 10.

As illustrated in FIG. 2, each of light reflection sheets 30 is a tape-shaped light reflection member extending in the longitudinal direction of string 10S, and has an elongated rectangular shape and a thin plate shape, as an example. Light reflection sheet 30 has a length of 100 mm to 130 mm, a width of 1 mm to 20 mm and a thickness of 0.05 mm to 0.5 mm, for example. As an example, light reflection sheet 30 is 125 mm in length, 5 mm in width and 0.1 mm in thickness. Each light reflection sheet 30 is disposed so as to straddle two adjacent solar cells 10. Thus, the width of light reflection sheet 30 is larger than the distance of the gap G between two adjacent solar cells 10.

Light made incident on light reflection sheet 30 is reflected. Light reflection sheet 30 in this embodiment diffuses and reflects the incident light and thus functions as a light diffusion reflection member. That is, light reflection sheet 30 is a light diffusion reflection sheet.

As illustrated in FIG. 3, light reflection sheet 30 includes resin base member 31 and light reflection film 32 formed on the surface of resin base member 31. Light reflection sheet 30 in this embodiment further includes adhesive 33 formed on the back surface of resin base member 31. That is, light reflection sheet 30 has a laminated structure of adhesive (adhesive layer) 33, resin base member 31, and light reflection film (light reflection layer) 32.

Resin base member 31 is made of an insulating resin material such as polyethylene terephthalate (PET) or acrylic, for example. Light reflection film 32 is a metal reflective film made of metal such as aluminum or silver, for example. Adhesive 33 is a resin adhesive made of an insulating resin material, for example.

In this embodiment, resin base member 31 is a PET sheet, light reflection film 32 is an aluminum deposited film, and adhesive 33 is a heat-sensitive adhesive or a pressure-sensitive adhesive made of EVA.

Moreover, unevenness 30a is formed on the surface of resin base member 31. Light reflection film 32 is formed on the surface of unevenness 30a by vapor deposition or the like, for example. Therefore, light reflection film 32 has uneven surface shape along with the uneven shape of unevenness 30a. The uneven shape of light reflection film 32 enables light made incident on light reflection sheet 30 to be diffusely reflected in a predetermined direction.

As for unevenness 30a, for example, the height between the concave and convex parts is 5 µm to 100 µm, and the interval (pitch) between adjacent convexities is 20 µm to 400 µm. In this embodiment, the height between the concave and convex parts is 12 µm, and the interval (pitch) between adjacent convexities is 40 µm.

Moreover, in this embodiment, light reflection sheet 30 is disposed such that the surface of light reflection film 32 faces front protective member 40. That is, light reflection sheet 30 is disposed such that resin base member 31 is positioned on the back protective member 50 side and light reflection film 32 is positioned on the front protective member 40 side. Note that, in this embodiment, since light reflection film 32 is disposed on the front protective member 40 side, the material of resin base member 31 may be any of a translucent or transparent material such as a transparent material and a non-transparent material such as a white material and a black material.

As described above, the gap G between two adjacent solar cells 10 is covered with light reflection sheet 30. Thus, when light entering solar cell module 1 is made incident on the surface of light reflection sheet 30, the uneven shape of light reflection film 32 diffusely reflects (scatters) the light. The diffusely-reflected light is reflected on the interface between front protective member 40 and the air layer or the interface between front protective member 40 and bonding member 60, and then guided to solar cells 10. This enables even light entering a region in the gap G between two adjacent solar cells 10, which is an ineffective region (in this embodiment, a region in a gap between two adjacent strings 10S, i.e., a region where the incident light cannot contribute to power generation) to effectively contribute to power generation. As a result, the power generation efficiency of solar cell module 1 is improved.

Particularly, in this embodiment, light reflection sheet 30 is provided not on back protective member 50 or the like, but in a power generation ineffective region at the edge of solar cell 10. Thus, productivity is improved and power generation capacity of solar cell 10 can be efficiently utilized.

Moreover, there is a bent portion in a portion of light reflection sheet 30 corresponding to the gap G. That is, light reflection sheet 30 is intentionally deflected so that a bent portion (deflected portion) is included in light reflection sheet 30.

The bent portion of light reflection sheet 30 is a portion where the surface shape in the cross-section of light reflection sheet 30 includes a curve having a minimum point as the lowest point at least in a part of the curve. In FIG. 3, for example, the bent portion of light reflection sheet 30 is a portion where the cross-sectional shape is a curved shape. As described above, in this embodiment, light reflection sheet 30 has a curved portion (bent portion) formed by curving at least a part thereof between adjacent solar cells 10. To be more specific, the surface (front surface) of light reflection sheet 30 on the front protective member 40 side and the surface (back surface) thereof on the back protective member 50 side are both curved surfaces.

In this embodiment, the portion of light reflection sheet 30 corresponding to the gap G is entirely curved so as to protrude toward the gap G. That is, the deflection direction of light reflection sheet 30 is the direction toward the gap G, and light reflection sheet 30 is curved so as to be deflected toward the gap G. To be more specific, in the bent portion (curved portion) of light reflection sheet 30, the surface of light reflection sheet 30 (in this embodiment, the surface of adhesive 33) on the solar cell 10 side enters into the gap G beyond the surface of solar cell 10 where light reflection sheet 30 is provided. Furthermore, in the bent portion of light reflection sheet 30, even the surface of light reflection sheet 30 (in this embodiment, the surface of light reflection film 32) opposite to the surface thereof on the solar cell 10 side enters into the gap G beyond the surface of solar cell 10 where light reflection sheet 30 is provided.

Figure 4:
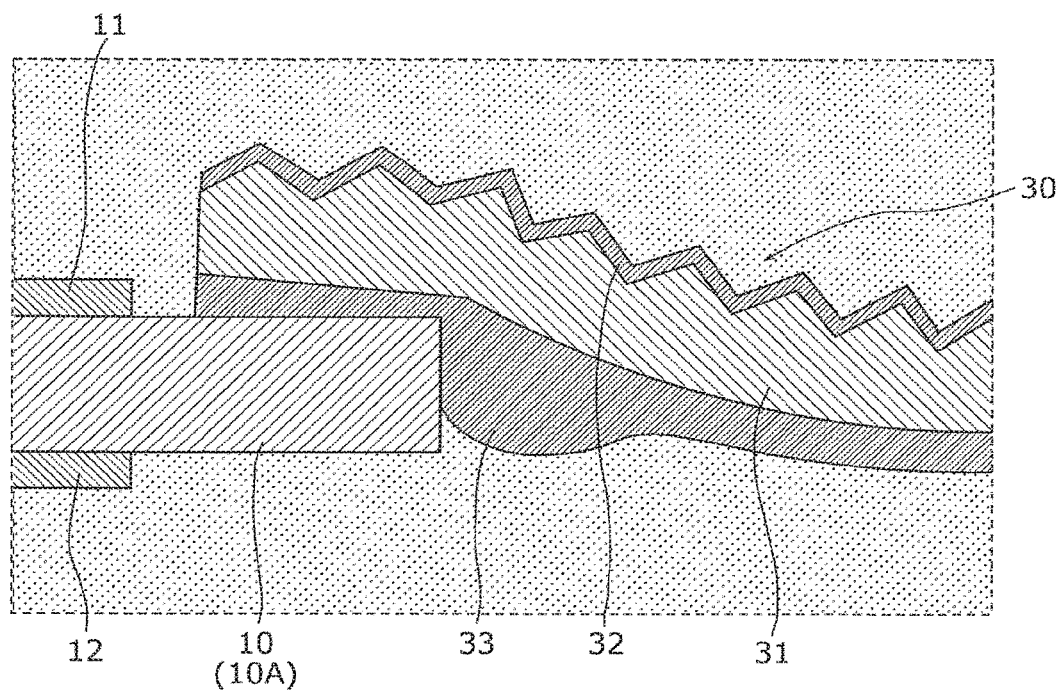
FIG. 4 is a cross-sectional view (enlarged cross-sectional view of Region Y surrounded by the broken line in FIG. 3) of the solar cell module according to Embodiment 1.

Here, with reference to FIG. 4, detailed description is given of the connected portion (attached portion) between light reflection sheet 30 and solar cells 10. FIG. 4 is an enlarged cross-sectional view of Region Y surrounded by the broken line in FIG. 3.

As illustrated in FIGS. 3 and 4, light reflection sheet 30 is bonded to solar cells 10 by attaching the surface of resin base member 31 opposite to the light reflection film 32 side to solar cells 10 (first solar cell 10A and second solar cell 10B) with adhesive 33.

As illustrated in FIG. 4, the thickness of adhesive 33 in a portion lateral to the end of solar cell 10 is larger than that in the other portion of adhesive 33. On the other hand, the thickness of adhesive 33 at the corner of the end of solar cell 10 (at the corner between the front surface and the side surface of solar cell 10) is smaller than that in the other portion of adhesive 33.

Note that FIG. 4 illustrates the structure of the connected portion between light reflection sheet 30 and first solar cell 10A of the two adjacent solar cells, first solar cell 10A and second solar cell 10B. However, the same applies to the connected portion between light reflection sheet 30 and second solar cell 10B on the opposite side.

Light reflection sheet 30 thus configured is sealed by bonding member 60. That is, light reflection sheet 30 is bonded and fixed by bonding member 60.

Note that, in this embodiment, the shape of unevenness 30a in light reflection sheet 30 is a triangular groove shape along the longitudinal direction of light reflection sheet 30. However, the invention is not limited thereto, but the shape thereof may be a conical shape, a quadrangular pyramid shape, a polyangular pyramid shape, a combination thereof or the like, as long as the shape can scatter light.

[Front Protective Member and Back Protective Member]

Front protective member 40 (first protective member) is a member configured to protect the front surface of solar cell module 1, and protects the inside (solar cells 10 and the like) of solar cell module 1 from the external environment such as weather and external impact. As illustrated in FIG. 1B, front protective member 40 is provided on the front side of solar cell 10, and protects the front-side light receiving surface of solar cell 10.

Front protective member 40 includes a transparent member that transmits light in a wavelength band used for photoelectric conversion in solar cell 10. Front protective member 40 is, for example, a glass substrate (transparent glass substrate) made of a transparent glass material or a resin substrate made of a film-shaped or plate-shaped transparent and water-impervious hard resin material.

On the other hand, back protective member 50 (second protective member) is a member configured to protect the back surface of solar cell module 1, and protects the inside of solar cell module 1 from the external environment. As illustrated in FIG. 1B, back protective member 50 is provided on the back side of solar cell 10.

Back protective member 50 is a film-shaped or plate-shaped resin sheet made of a resin material such as polyethylene terephthalate (PET) and polyethylene naphthalate (PEN), for example.

Since solar cell module 1 in this embodiment is of the single-sided light receiving type, back protective member 50 may be a non-transparent plate body or film. In this case, a non-transparent member (light blocking member) may be used as back protective member 50, such as a black member or a laminated film such as a resin film having metal foil such as aluminum foil therein. Note that back protective member 50 is not limited to the non-transparent member but may be a transparent member such as a glass sheet or a glass substrate made of a glass material.

Bonding member 60 is provided between front protective member 40 and back protective member 50. Front protective member 40 and back protective member 50 are bonded and fixed to solar cells 10 by bonding member 60.

[Bonding Member]

Bonding member (filler material) 60 is disposed between front protective member 40 and back protective member 50. In this embodiment, bonding member 60 is provided to fill a space between front protective member 40 and back protective member 50.

As illustrated in FIG. 3, bonding member 60 includes front-side bonding member 61 and back-side bonding member 62. Solar cells 10 are sandwiched between front-side bonding member 61 and back-side bonding member 62. For example, bonding member 60 is formed by performing lamination (laminate processing) of front-side bonding member 61 and back-side bonding member 62 sandwiching strings 10S therebetween.

To be more specific, after strings 10S are formed by connecting solar cells 10 with tab wiring members 20, strings 10S are sandwiched between front-side bonding member 61 and back-side bonding member 62. Then, front protective member 40 and back protective member 50 are further disposed thereabove and therebelow, and thermocompression bonding is performed in a vacuum at a temperature of 100° C. or more, for example. This thermocompression bonding heats and melts front-side bonding member 61 and back-side bonding member 62 to form bonding member 60 that seals solar cells 10.

Front-side bonding member 61 is a resin sheet made of a resin material such as ethylene-vinyl acetate (EVA) or polyolefin, for example, and is disposed between solar cells 10 and front protective member 40. The front-side bonding member is mainly provided so as to fill a space between solar cells 10 and front protective member 40 by laminate processing. For example, front-side bonding member 61 is a transparent resin sheet. As an example, front-side bonding member 61 is a transparent resin sheet made of a hot-melt adhesive made of EVA.

Back-side bonding member 62 is a resin sheet made of a resin material such as ethylene-vinyl acetate (EVA) or polyolefin, for example, and is disposed between solar cells 10 and back protective member 50. Back-side bonding member 62 is mainly provided so as to fill a space between solar cells 10 and back protective member 50 by laminate processing. Note that, since solar cell module 1 in this embodiment is of the single-sided light receiving type, a black or white resin sheet is used as back-side bonding member 62. However, the invention is not limited thereto. As an example, back-side bonding member 62 is a white resin sheet made of a hot-melt adhesive made of EVA.

[Frame]

Frame 70 is an outer frame that covers the peripheral edge of solar cell module 1. Frame 70 is an aluminum frame made of aluminum, for example. As illustrated in FIG. 1A, four frames 70 are used and attached to the four sides of solar cell module 1, respectively. Frames 70 are fixed to the respective sides of solar cell module 1 with an adhesive, for example.

Note that, although not illustrated, solar cell module 1 is provided with a terminal box to take out power generated by solar cells 10. The terminal box is fixed to back protective member 50, for example. The terminal box includes circuit components mounted on a circuit board.

[Advantageous Effects and the Like]

Figure 5:
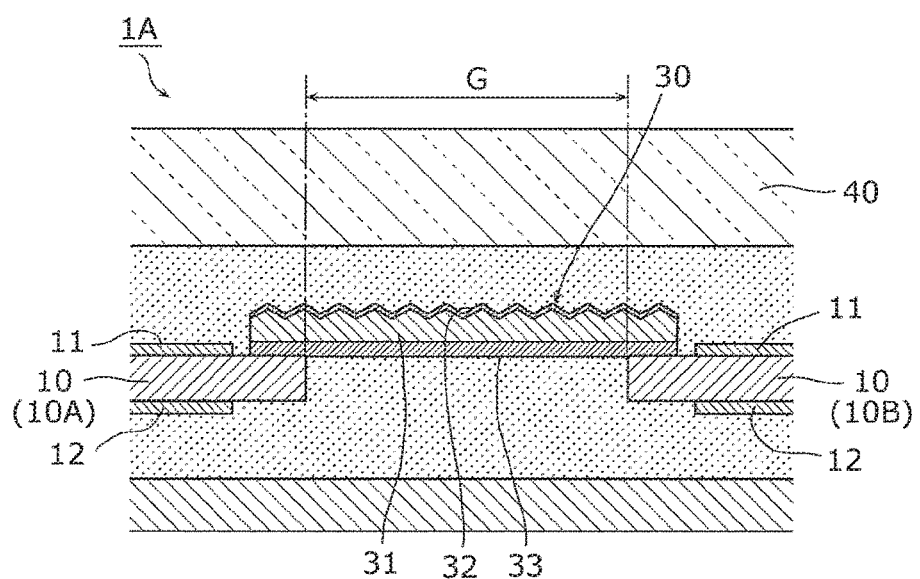
FIG. 5 is an enlarged cross-sectional view around a light reflection sheet in a solar cell module according to a comparative example.

Next, advantageous effects of solar cell module 1 according to this embodiment are described in comparison to solar cell module 1A according to a comparative example shown in FIG. 5. FIG. 5 is a partially enlarged cross-sectional view around a light reflection sheet in the solar cell module according to the comparative example.

As illustrated in FIG. 5, in solar cell module 1A of the comparative example, light reflection sheet 30 is provided so as to straddle two solar cells 10 (first solar cell 10A and second solar cell 10B) disposed with a gap G therebetween, as in the case of solar cell module 1 according to this embodiment.

However, solar cell module 1A of the comparative example is different from solar cell module 1 according to this embodiment in that light reflection sheet 30 is provided on two solar cells 10 without being bent.

Thus, when there is a temperature change due to a temperature cycling test or the like conducted on solar cell module 1A, two solar cells 10 apply tensile or compressive stress to each other through light reflection sheet 30. As a result, the stress applied to solar cells 10 may deteriorate solar cells 10 due to damage and the like.

On the other hand, as illustrated in FIG. 3, there is a previously bent portion in a portion of light reflection sheet 30 corresponding to the gap G, light reflection sheet 30 being disposed so as to straddle two solar cells 10 (first solar cell 10A and second solar cell 10B). For example, light reflection sheet 30 is provided in a deflected state on solar cells 10.

Thus, even when there is a temperature change in solar cell module 1, it is possible to suppress the stress which could be applied to solar cells 10 by two solar cells 10, which are connected by light reflection sheet 30, pulling or compressing each other. That is, a certain solar cell 10 (e.g., first solar cell 10A) can absorb stress from another solar cell 10 (e.g., second solar cell 10B) in the bent portion (slack) of light reflection sheet 30. Therefore, even when light reflection sheet 30 is disposed so as to straddle two solar cells 10, it is possible to suppress the deterioration of solar cells 10 due to damage and the like caused by the stress associated with the temperature change.

In this embodiment, the bent portion of light reflection sheet 30 is a portion where the surface shape in the cross-section of light reflection sheet 30 includes a curve having a minimum point as the lowest point at least in a part of the curve.

To be more specific, the bent portion of light reflection sheet 30 has a curved shape.

Thus, the stress on solar cells 10 can be effectively absorbed. Moreover, light reflection sheet 30 can be easily deflected.

Furthermore, in this embodiment, the portion of light reflection sheet 30 corresponding to the gap G is entirely curved at a substantially constant curvature.

Light reflection sheet 30 can be easily curved by bending the entire light reflection sheet rather than a part thereof. Therefore, the portion of light reflection sheet 30 corresponding to the gap G can be easily formed into a curved shape.

Moreover, in this embodiment, the bent portion of light reflection sheet 30 protrudes toward the gap G. That is, the light-receiving surface (surface on the front protective member 40 side) of light reflection sheet 30 is a concave surface.

Thus, light reflection sheet 30 can be easily curved, and can be easily disposed on solar cells 10 in a curved state.

Moreover, in this embodiment, the surface of light reflection sheet 30 on the solar cell 10 side enters into the gap G beyond the surface of solar cell 10 where light reflection sheet 30 is provided, in the bent portion of light reflection sheet 30. That is, the back surface (surface on the back protective member 50 side) of light reflection sheet 30 enters into the gap G beyond the light-receiving surface (surface on the front protective member 40 side) of solar cell 10.

Accordingly, light reflection sheet 30 can be appropriately deflected, and thus the stress on solar cells 10 can be effectively absorbed.

Moreover, in this embodiment, the surface of light reflection sheet 30 opposite to the surface thereof on the solar cell 10 side also enters into the gap G beyond the surface of solar cell 10 where light reflection sheet 30 is provided, in the bent portion of light reflection sheet 30. That is, the light-receiving surface (surface on the front protective member 40 side) of light reflection sheet 30 enters into the gap G beyond the light-receiving surface (surface on the front protective member 40 side) of solar cell 10.

Thus, the deflection amount of light reflection sheet 30 can be increased. Thus, the stress on solar cells 10 can be more effectively absorbed. For example, in a spot with a large stress on solar cells 10 due to a temperature change, the deflection amount of light reflection sheet 30 is preferably increased.

Note that the light-receiving surface (surface on the front protective member 40 side) of light reflection sheet 30 may be configured not to enter into the gap G beyond the light-receiving surface (surface on the front protective member 40 side) of solar cell 10 while allowing the back surface (surface on the back protective member 50 side) of light reflection sheet 30 to enter into the gap G beyond the light-receiving surface (surface on the front protective member 40 side) of solar cell 10.

Thus, reduction in effect of improving power generation efficiency of light reflection sheet 30 due to excessive deflection of light reflection sheet 30 can be suppressed while absorbing the stress on solar cells 10 by appropriately deflecting light reflection sheet 30.

Moreover, in this embodiment, light reflection sheet 30 includes resin base member 31 and light reflection film 32 formed on one surface of resin base member 31. Light reflection sheet 30 is provided on solar cells 10 by attaching the other surface of resin base member 31 to solar cells 10 with adhesive 33.

Thus, curved light reflection sheet 30 can be easily attached to solar cells 10 in a curved state. For example, light reflection sheet 30 can be easily temporarily joined to solar cells 10 before performing laminate processing of strings 10S between front-side bonding member 61 and back-side bonding member 62 and between front protective member 40 and back protective member 50. Therefore, light reflection sheet 30 can be easily disposed at a desired position. Thus, light entering light reflection sheet 30 can be reflected and guided to a desired spot on solar cell 10. As a result, a desired effect of improving power generation efficiency by disposing light reflection sheet 30 can be achieved.

Moreover, as illustrated in FIG. 4, in light reflection sheet 30 according to this embodiment, the thickness of adhesive 33 in a portion lateral to the end of solar cell 10 is larger than that in the other portion.

Accordingly, adhesive 33 is applied up to the side of the end of solar cell 10. Thus, light reflection sheet 30 and solar cell 10 can be firmly bonded. Therefore, it is possible to suppress the detachment of light reflection sheet 30 even when stress is applied to solar cell 10.

Furthermore, in this embodiment, the thickness of adhesive 33 at the corner of the end of solar cell 10 is smaller than that in the other portion. In this embodiment, as a result of adhesive 33, which is pushed at the corner of the end of solar cell 10, running around the side of the end of solar cell 10, the thickness of adhesive 33 is reduced at the corner of the end of solar cell 10.

Thus, by using an emulsion adhesive or the like as adhesive 33, light reflection sheet 30 and solar cell 10 can be firmly bonded.

Embodiment 2

Figure 6:
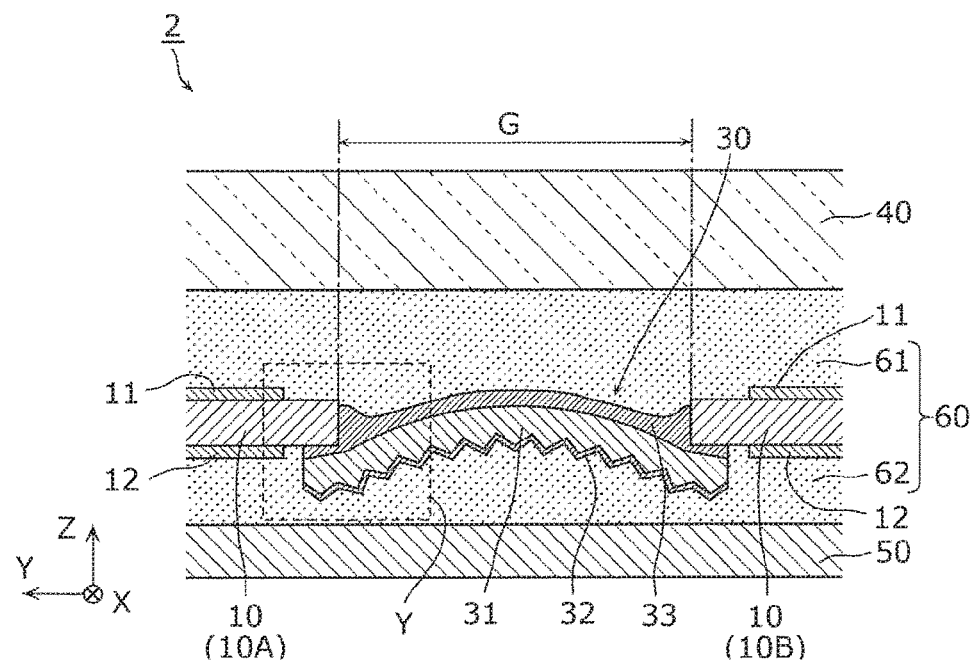
FIG. 6 is an enlarged cross-sectional view around a light reflection sheet in a solar cell module according to Embodiment 2.
Figure 7:
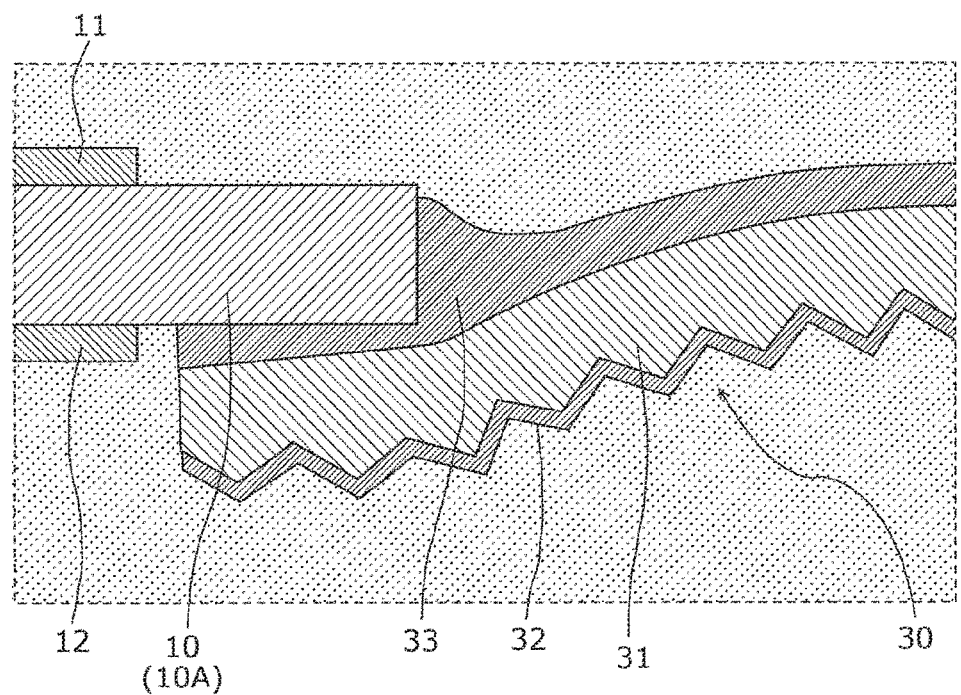
FIG. 7 is an enlarged cross-sectional view (enlarged cross-sectional view of Region Y surrounded by the broken line in FIG. 6) around the light reflection sheet in the solar cell module according to Embodiment 2.

Next, with reference to FIGS. 6 and 7, solar cell module 2 according to Embodiment 2 is described. FIG. 6 is an enlarged cross-sectional view around a light reflection sheet in a solar cell module according to Embodiment 2. FIG. 7 is an enlarged cross-sectional view of Region Y surrounded by the broken line in FIG. 6.

As illustrated in FIGS. 6 and 7, in solar cell module 2 according to this embodiment, light reflection sheet 30 is disposed so as to straddle two solar cells 10 disposed with a gap G therebetween, as in the case of solar cell module 1 according to Embodiment 1 described above.

Meanwhile, in Embodiment 1 described above, light reflection sheet 30 is provided on the surface (front surface) of solar cell 10 on the front protective member 40 side, and is disposed such that the surface of light reflection film 32 faces front protective member 40. However, in this embodiment, light reflection sheet 30 is provided on the surface (back surface) of solar cell 10 on the back protective member 50 side, and is disposed such that the surface of light reflection film 32 faces back protective member 50. That is, in this embodiment, light reflection sheet 30 in Embodiment 1 is inverted and disposed on the back surface of solar cell 10. Moreover, light reflection sheet 30 is disposed such that resin base member 31 is positioned on the front protective member 40 side and light reflection film 32 is positioned on the back protective member 50 side. To be more specific, light reflection sheet 30 is disposed so as to straddle the back surfaces of two solar cells 10 such that adhesive 33 is bonded to the surfaces of solar cells 10 on the back protective member 50 side.

In this embodiment, again, there is a bent portion in a portion of light reflection sheet 30 corresponding to the gap G between two adjacent solar cells 10. That is, light reflection sheet 30 has a curved portion formed by curving at least a part thereof between adjacent solar cells 10.

In solar cell module 2 according to this embodiment, as in the case of solar cell module 1 according to Embodiment 1, there is a previously bent portion in a portion of light reflection sheet 30 corresponding to the gap G, light reflection sheet 30 being disposed so as to straddle two solar cells 10.

Thus, even when there is a temperature change in solar cell module 2, it is possible to suppress the stress which could be applied to solar cells 10, and the deterioration of solar cells 10.

Moreover, in this embodiment, again, the bent portion of light reflection sheet 30 has a curved shape.

Thus, the stress on solar cells 10 can be effectively absorbed. Moreover, light reflection sheet 30 can be easily deflected.

Moreover, in this embodiment, again, the portion of light reflection sheet 30 corresponding to the gap G is entirely curved.

Therefore, the portion of light reflection sheet 30 corresponding to the gap G can be easily formed into a curved shape.

Moreover, in this embodiment, again, the bent portion of light reflection sheet 30 protrudes toward the gap G.

Thus, light reflection sheet 30 can be easily curved, and can be easily disposed on solar cells 10 in a curved state.

Moreover, in this embodiment, the surface of light reflection sheet 30 on the solar cell 10 side enters into the gap G beyond the surface of solar cell 10 where light reflection sheet 30 is provided, in the bent portion of light reflection sheet 30.

Accordingly, light reflection sheet 30 can be appropriately deflected, and thus the stress on solar cells 10 can be effectively absorbed.

Moreover, in this embodiment, again, the surface of light reflection sheet 30 opposite to the surface thereof on the solar cell 10 side also enters into the gap G beyond the surface of solar cell 10 where light reflection sheet 30 is provided, in the bent portion of light reflection sheet 30.

Thus, the deflection amount of solar cells 10 can be increased. As a result, the stress on solar cells 10 can be more effectively absorbed.

Moreover, in this embodiment, again, light reflection sheet 30 is provided on solar cells 10 by attaching the other surface of resin base member 31 to solar cells 10 with adhesive 33.

Thus, curved light reflection sheet 30 can be easily attached to solar cells 10 in a curved state.

Moreover, as illustrated in FIG. 7, in this embodiment, again, the thickness of adhesive 33 in light reflection sheet 30 in a portion lateral to the end of solar cell 10 is larger than that in the other portion.

Accordingly, adhesive 33 is applied to the side of the end of solar cell 10. Thus, light reflection sheet 30 and solar cell 10 can be firmly bonded.

Furthermore, in this embodiment, again, the thickness of adhesive 33 at the corner of the end of solar cell 10 is smaller than that in the other portion.

Thus, by using an emulsion adhesive or the like as adhesive 33, light reflection sheet 30 and solar cell 10 can be firmly bonded.

Note that, in this embodiment, light reflection sheet 30 is disposed on the back surface of solar cell 10. However, the main light-receiving surface of light reflection sheet 30 is the surface on the front protective member 40 side. Thus, adhesive 33 and resin base member 31 positioned closer to the front protective member 40 side than light reflection film 32 preferably include a translucent member such as a transparent member.

Embodiment 3

Figure 8:
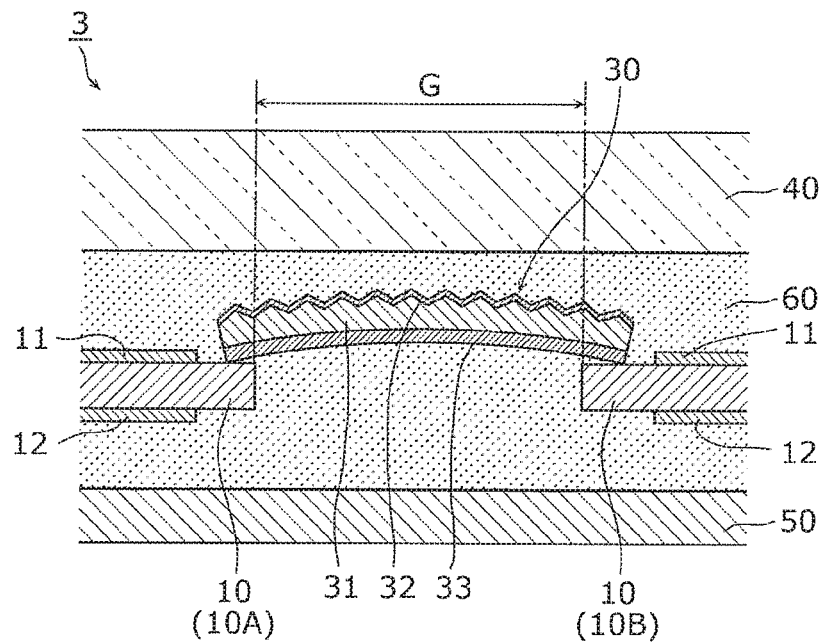
FIG. 8 is an enlarged cross-sectional view around a light reflection sheet in a solar cell module according to Embodiment 3.

Next, with reference to FIG. 8, solar cell module 3 according to Embodiment 3 is described. FIG. 8 is an enlarged cross-sectional view around a light reflection sheet in the solar cell module according to Embodiment 3.

As illustrated in FIG. 8, in solar cell module 3 according to this embodiment, as in the case of solar cell module 1 according to Embodiment 1 described above, light reflection sheet 30 is disposed so as to straddle two solar cells 10 disposed with a gap G therebetween, and is provided on the surface (front surface) of solar cell 10 on the front protective member 40 side.

Moreover, in this embodiment, again, there is a bent portion in a portion of light reflection sheet 30 corresponding to the gap G between two adjacent solar cells 10. That is, light reflection sheet 30 has a curved portion formed by curving at least a part thereof between adjacent solar cells 10.

Meanwhile, in Embodiment 1 described above, the bent portion of light reflection sheet 30 protrudes toward the gap G. However, in this embodiment, the bent portion of light reflection sheet 30 protrudes in a direction away from the gap G. That is, the deflection direction of light reflection sheet 30 is outward of solar cell module 1, and light reflection sheet 30 is curved so as to be deflected outward.

In solar cell module 3 according to this embodiment, as in the case of solar cell module 1 according to Embodiment 1, there is a previously bent portion in a portion of light reflection sheet 30 corresponding to the gap G, light reflection sheet 30 being disposed so as to straddle two solar cells 10.

Thus, even when there is a temperature change in solar cell module 3, it is possible to suppress the stress which could be applied to solar cells 10, and the deterioration of solar cells.

Moreover, in this embodiment, again, the bent portion of light reflection sheet 30 has a curved shape.

Thus, the stress on solar cells 10 can be effectively absorbed. Moreover, light reflection sheet 30 can be easily deflected.

Moreover, in this embodiment, again, the portion of light reflection sheet 30 corresponding to the gap G is entirely curved.

Therefore, the portion of light reflection sheet 30 corresponding to the gap G can be easily formed into a curved shape.

Embodiment 4

Figure 9:
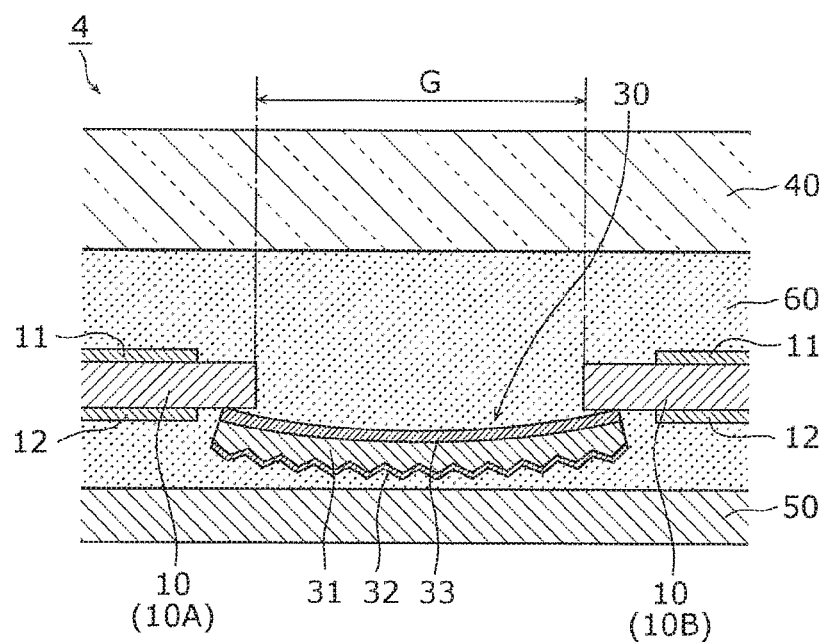
FIG. 9 is an enlarged cross-sectional view around a light reflection sheet in a solar cell module according to Embodiment 4.

Next, with reference to FIG. 9, solar cell module 4 according to Embodiment 4 is described. FIG. 9 is an enlarged cross-sectional view around a light reflection sheet in the solar cell module according to Embodiment 4.

As illustrated in FIG. 9, in solar cell module 4 according to this embodiment, light reflection sheet 30 is disposed so as to straddle two solar cells 10 disposed with a gap G therebetween, as in the case of solar cell module 3 according to Embodiment 3 described above. However, in this embodiment, light reflection sheet 30 is provided on the surface (back surface) of solar cell 10 on the back protective member 50 side. That is, in this embodiment, light reflection sheet 30 in Embodiment 3 is inverted and disposed on the back surface of solar cell 10.

In this embodiment, again, there is a bent portion in a portion of light reflection sheet 30 corresponding to the gap G between two adjacent solar cells 10.

Thus, even when there is a temperature change in solar cell module 4, it is possible to suppress the stress which could be applied to solar cells 10, and the deterioration of solar cells.

Moreover, in this embodiment, again, the bent portion of light reflection sheet 30 has a curved shape.

Thus, the stress on solar cells 10 can be effectively absorbed. Moreover, light reflection sheet 30 can be easily deflected.

Moreover, in this embodiment, again, the portion of light reflection sheet 30 corresponding to the gap G is entirely curved.

Therefore, the portion of light reflection sheet 30 corresponding to the gap G can be easily formed into a curved shape.

Modified Example and the Like

Although the solar cell modules according to the invention are described above based on Embodiments 1 to 4, the invention is not limited to Embodiments 1 to 4 described above.

For example, in the above embodiments, one light reflection sheet 30 is used and disposed so as to straddle two solar cells 10. However, the invention is not limited thereto. Light reflection sheet 30 may include more than one light reflection member.

Figure 10:
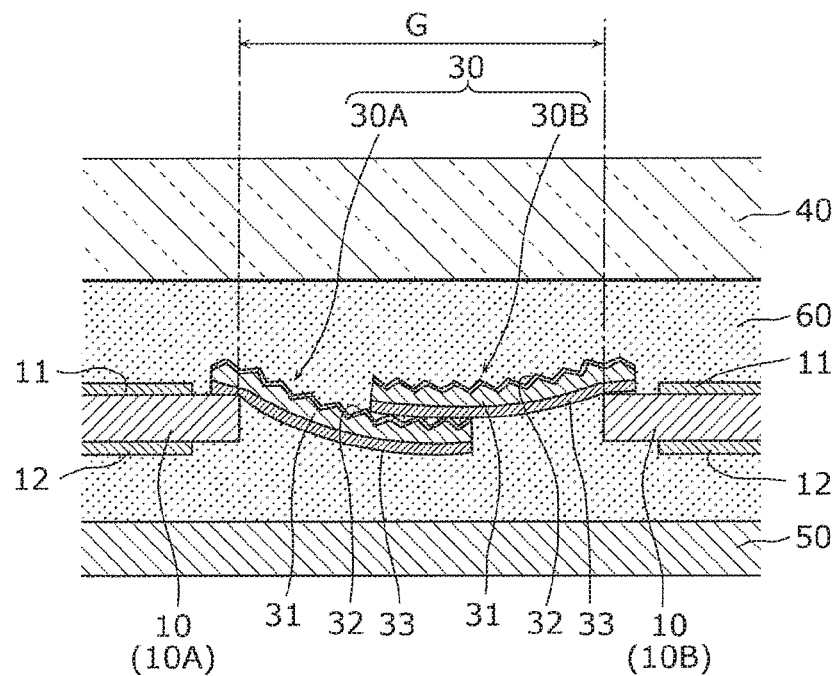
FIG. 10 is an enlarged cross-sectional view around a light reflection sheet in a solar cell module according to Modified Example 1.

For example, as illustrated in FIG. 10, light reflection sheet 30 striding over (bridging between) two solar cells 10 may be one obtained by connecting first light reflection member 30A and second light reflection member 30B. To be more specific, one end of first light reflection member 30A may be attached to first solar cell 10A and one end of second light reflection member 30B may be attached to second solar cell 10B so as to hang over the gap G. In this case, the other end of first light reflection member 30A and the other end of second light reflection member 30B may be overlapped with each other or may be configured to have side faces thereof in contact with each other. The same effect as that of Embodiment 1 can also be achieved when light reflection sheet 30 includes more than one member as described above. Note that, for the members of first and second light reflection members 30A and 30B, the light reflection sheet in Embodiment 1 can be used.

Moreover, in the above embodiments, the portion of light reflection sheet 30 corresponding to the gap G is entirely curved. However, the invention is not limited thereto.

Figure 11:
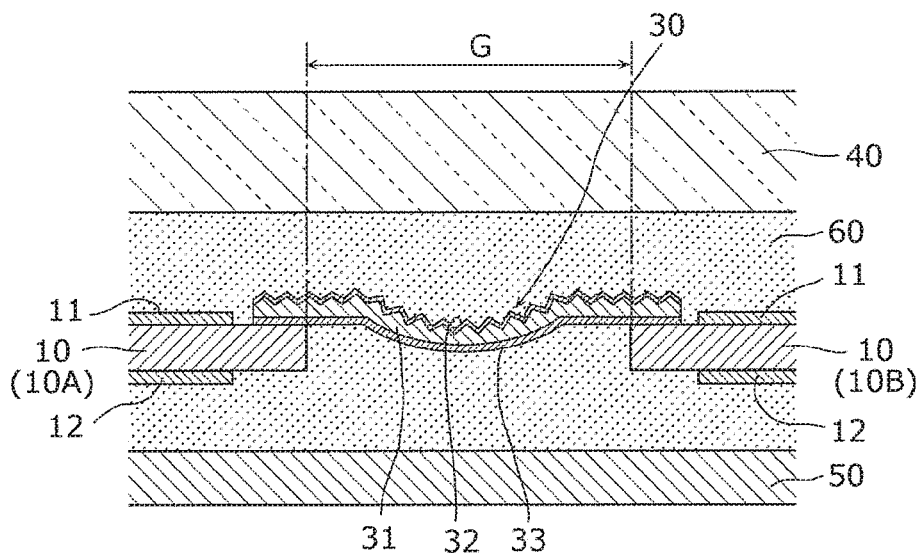
FIG. 11 is an enlarged cross-sectional view around a light reflection sheet in a solar cell module according to Modified Example 2.

For example, as illustrated in FIG. 11, the portion of light reflection sheet 30 corresponding to the gap G may be partially curved. In this case, the position of the curved portion of light reflection sheet 30 is not limited to the center as illustrated in FIG. 11, but may be closer to first solar cell 10A or second solar cell 10B than the center.

Figure 12:
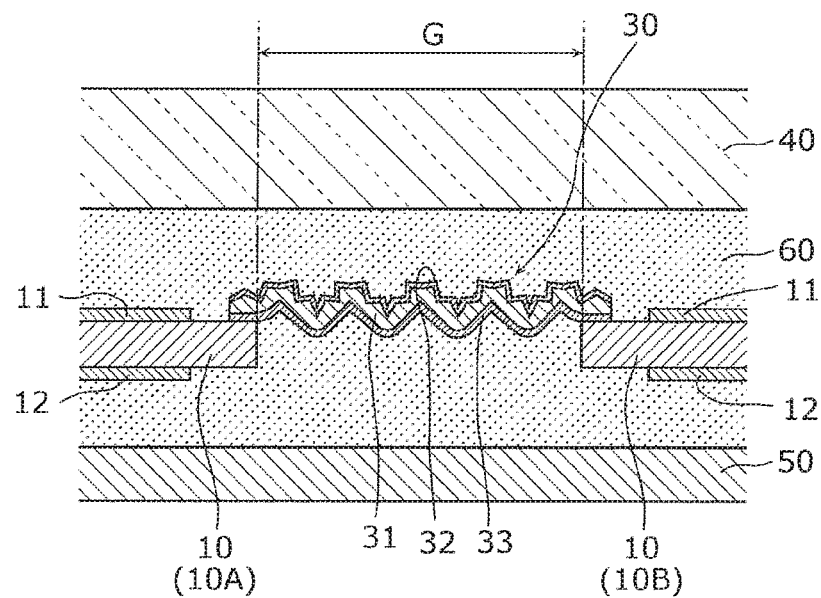
FIG. 12 is an enlarged cross-sectional view around a light reflection sheet in a solar cell module according to Modified Example 3.

Alternatively, as illustrated in FIG. 12, the portion of light reflection sheet 30 corresponding to the gap G may be deflected in a wave pattern such that light reflection sheet 30 undulates. That is, more than one curved portion may be formed in light reflection sheet 30.

With the configurations as illustrated in FIGS. 11 and 12, the same effect as that of Embodiment 1 can also be achieved. Moreover, in the above embodiments, light reflection sheet 30 has the gently curved shape that shallowly enters into the gap G. However, the invention is not limited thereto.

Figure 13:
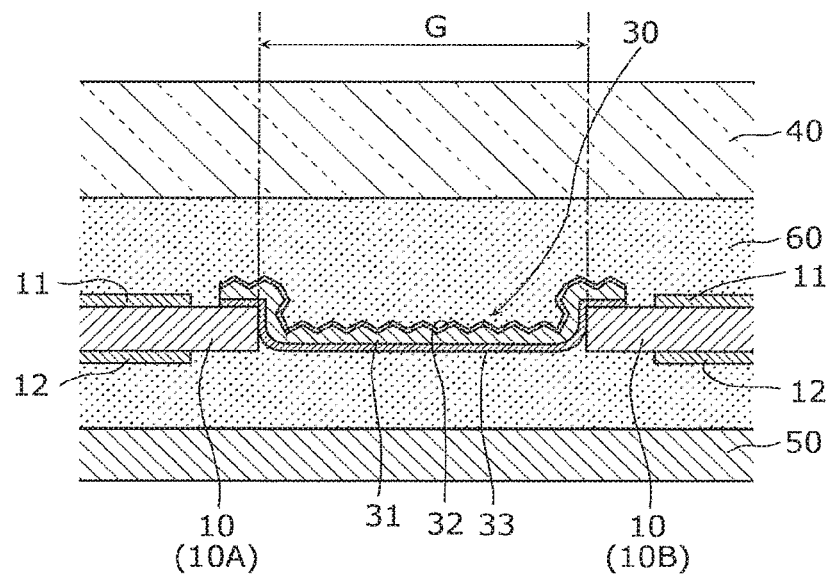
FIG. 13 is an enlarged cross-sectional view around a light reflection sheet in a solar cell module according to Modified Example 4.

For example, as illustrated in FIG. 13, the portion of light reflection sheet 30 corresponding to the gap G may be entirely formed into a U-shape, and light reflection sheet 30 may be configured to deeply enter into the gap G. In this case, again, the same effect as that of Embodiment 1 can be achieved.

Note that the configurations illustrated in FIGS. 10 to 13 can also be applied to the cases of Embodiments 2 to 4.

Figure 14:
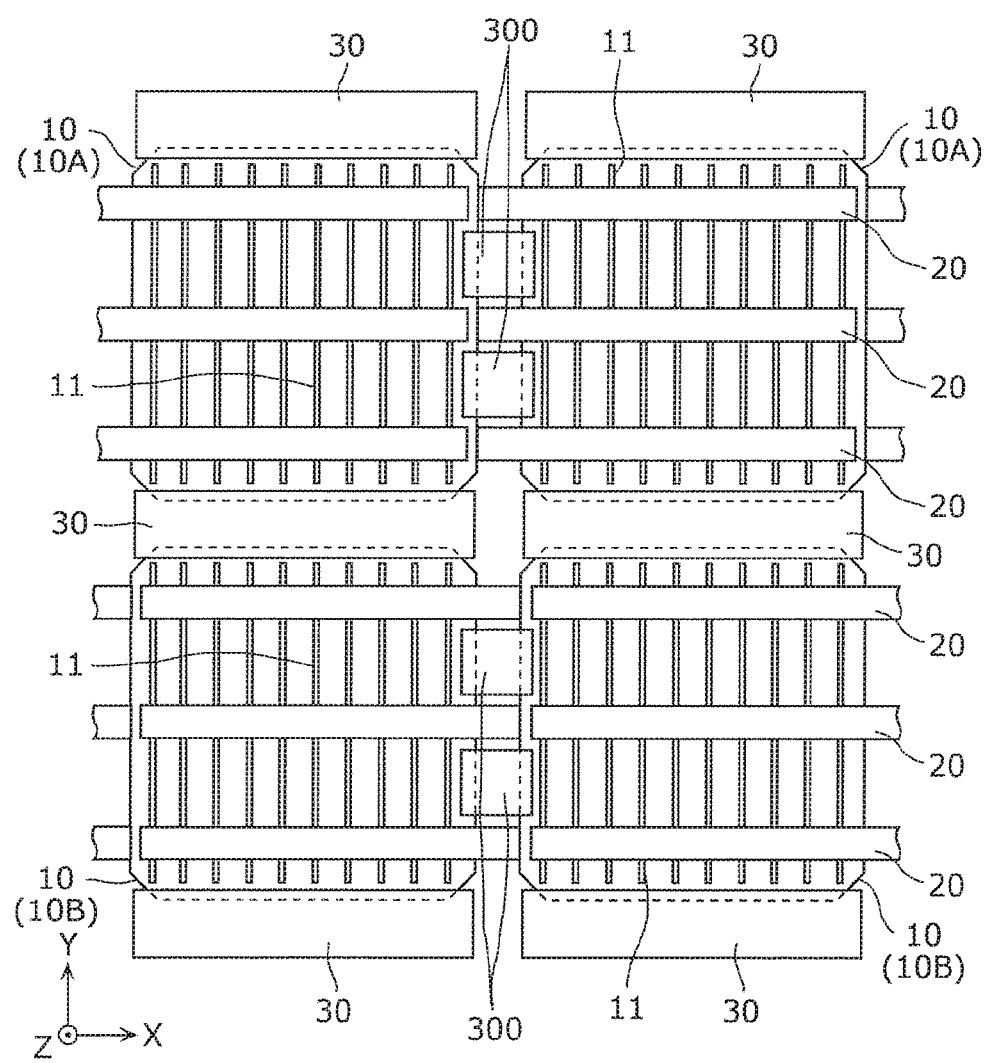
FIG. 14 is a partially enlarged plan view of a solar cell module according to Modified Example 5.

Moreover, in the above embodiments, light reflection sheet 30 is disposed in the gap between two adjacent strings 10S. However, the invention is not limited thereto. For example, as illustrated in FIG. 14, light reflection sheet 300 may be disposed in a gap between adjacent solar cells 10 within string 10S. Light reflection sheet 300 has the same configuration as that of light reflection sheet 30, and can be attached to solar cells 10 with the same arrangement and shape as those of light reflection sheet 30.

Figure 15:
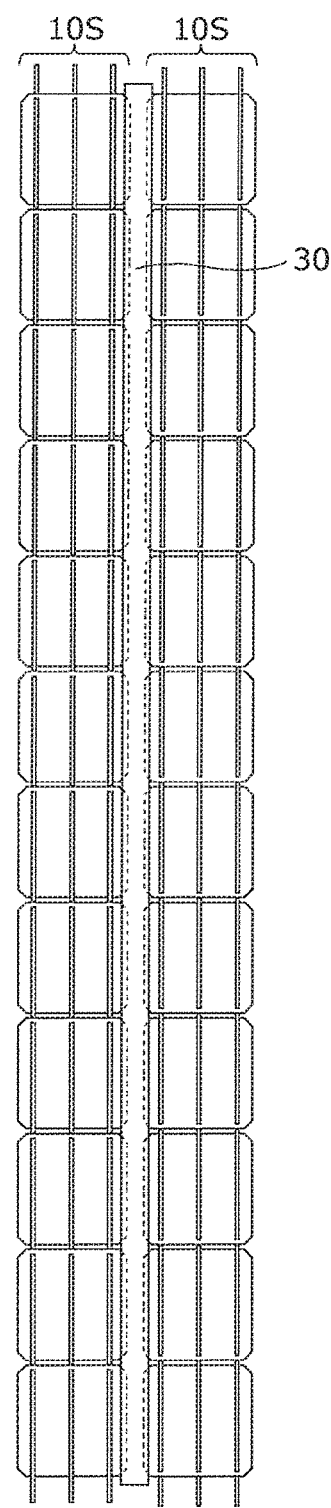
FIG. 15 is a partially enlarged plan view of a solar cell module according to Modified Example 6.

Moreover, in the above embodiments, light reflection sheet 30 is provided in every gap G between adjacent solar cells 10 in the gap between two adjacent strings 10S. However, the invention is not limited thereto. For example, light reflection sheet 30 may be provided so as to straddle solar cells 10 along the longitudinal direction of string 10S in the gap between two adjacent strings 10S. As an example, as illustrated in FIG. 15, light reflection sheet 30 may be one elongated light reflection sheet across the entire string 10S.

Moreover, in the above embodiments, light reflection sheets 30 are provided in the gaps G between all strings 10S. However, light reflection sheets 30 may be provided only in some of the gaps G. That is, there may be solar cells between which light reflection sheet 30 is not provided.

Moreover, in the above embodiments, light reflection sheets 30 in the solar cell module may all have the same curved shape, or may also have partially different curved shapes by partially changing the deflection amount or partially changing the deflection direction. Moreover, not all light reflection sheets 30 in the solar cell module need to have a bent portion formed therein, but the solar cell module may include some light reflection sheets 30 having a shape that is not curved as illustrated in FIG. 5.

Moreover, in the above embodiments, each of light reflection sheets 30 has a configuration including adhesive 33 previously provided. However, the invention is not limited thereto. For example, a light reflection sheet having a double-layered structure of resin base member 31 and light reflection film 32 may be used, and adhesive 33 may be used to dispose the light reflection sheet on solar cells 10, thereby bonding the light reflection sheet and solar cells 10.

Moreover, in the above embodiments, light reflection film 32 is formed on the top surface of light reflection sheet 30. However, the invention is not limited thereto. For example, light reflection sheet 30 may have a configuration in which a resin layer is further formed on light reflection film 32. In this case, the resin layer on light reflection film 32 is preferably made of a transparent material such as a transparent resin material.

Moreover, in the above embodiments, the semiconductor substrate in solar cell 10 is the n-type semiconductor substrate. However, the semiconductor substrate may be a p-type semiconductor substrate.

Moreover, in the above embodiments, the solar cell module is of the single-sided light receiving type, in which only front protective member 40 serves as the light-receiving surface. However, the solar cell module may be of a double-sided light receiving type, in which both of front protective member 40 and back protective member 50 serve as the light-receiving surfaces.

Moreover, in the above embodiments, the semiconductor material of the photoelectric converter in solar cell 10 is silicon. However, the invention is not limited thereto. As the semiconductor material of the photoelectric converter in solar cell 10, gallium arsenide (GaAs), indium phosphide (InP) or the like may be used.

Note that, besides the above, the invention also includes an embodiment obtained by making various changes conceived by those skilled in the art to the respective embodiments and an embodiment realized by arbitrarily combining the constituent elements and functions in the respective embodiments without departing from the spirit of the invention.

What is claimed is:

1. A solar cell module comprising:
   a first solar cell;
   a second solar cell disposed with a gap from the first solar cell such that the first and second solar cells are arranged in a first direction;
   a third solar cell disposed such that the first and third solar cells are arranged in a second direction intersecting with the first direction; and
   a light reflection sheet bridging between the first solar cell and the second solar cell across the gap, the light reflection sheet comprising a resin base member and a light reflection film provided on a light receiving side of the resin base member;
   front and back protective members, wherein the first to third solar cells and the light reflection sheet are provided between the front and back protective members;
   front-side and back-side bonding members sealing the first to third solar cells and the light reflection sheet between the front and back protective members, such that in an area corresponding to the gap, the front protective member, the front-side bonding member, the light reflection sheet, and the back-side bonding member are provided in the recited order, wherein
   each of the first solar cell, the second solar cell, and the third solar cell comprises finger electrodes on a light receiving surface thereof, each of the finger electrodes extending in the first direction,
   the resin base member is bonded to both the light receiving surface and a side surface of each of the first solar cell and the second solar cell,
   the light reflection film is electrically insulated from the first solar cell and the second solar cell by the resin base member interposed between the light reflection film and the light receiving surfaces of the first and second solar cells in a thickness direction of the solar cells,
   one end of the light reflection sheet in the first direction is provided on the light receiving surface of the first solar cell such that an end surface of the one end of the light reflection sheet in the first direction is spaced apart from and faces an end surface of the finger electrode of the first solar cell, and the other end of the light reflection sheet in the first direction is provided on the light receiving surface of the second solar cell such that an end surface of the other end of the light reflection sheet in the first direction is spaced apart from and faces an end surface of the finger electrode of the second solar cell, the light reflection film has an uneven shape including concave and convex parts such that the uneven shape of the light reflection film is provided in the area corresponding to the gap and in areas corresponding to the light receiving surfaces of the first and second solar cells, a portion of the light reflection sheet corresponding to the gap is at least partially curved in a single arcuate shape, as seen in a cross-section of the light reflection sheet, the front-side bonding member is in direct contact with the front protective member and is in direct contact with the concave parts of the light reflection film which is recessed toward the back-side bonding member, and in a plan view of the solar cell module, the front-side bonding member is overlapped with the light reflection sheet and the first and second solar cells.

2. The solar cell module according to claim 1, wherein in the curved portion, a back surface of the light reflection sheet enters into the gap beyond an extension of the light receiving surface of the first solar cell to which the light reflection sheet is attached.

3. The solar cell module according to claim 2, wherein in the curved portion, a light receiving surface of the light reflection sheet also enters into the gap beyond the extension of the light receiving surface of the first solar cell.

4. The solar cell module according to claim 1, wherein the portion of the light reflection sheet corresponding to the gap is entirely curved.

5. The solar cell module according to claim 1, wherein the light reflection sheet comprises light reflection members connected to one another.

6. The solar cell module according to claim 1, wherein the light reflection sheet further includes an adhesive on a back surface of the resin base member such that the resin base member of the light reflection sheet is bonded to the first solar cell and the second solar cell with the adhesive, and a thickness of the light reflection sheet in a first portion lateral to an end of the first solar cell is larger than that in a second portion at a center position between the first solar cell and the second solar cell.

7. The solar cell module according to claim 6, wherein a thickness of the adhesive at a corner of the end of the first solar cell is smaller than that in the second portion.

8. The solar cell module according to claim 1, further comprising a wiring member electrically connecting the first solar cell with the third solar cell, wherein the wiring member and the light reflection sheet are not overlapped with each other.

9. The solar cell module according to claim 1, wherein a height between the concave and convex parts of the uneven shape of the light reflection film is smaller than a height of the curve of the curved portion of the light reflection sheet.

10. The solar cell module according to claim 1, wherein the portion of the light reflection sheet corresponding to the gap includes only one minimum point as a lowest point in the gap, as seen in the cross-section of the light reflection sheet.

11. A solar cell module comprising:

a first solar cell;

a second solar cell disposed with a gap from the first solar cell such that the first and second solar cells are arranged in a first direction;

a third solar cell disposed such that the first and third solar cells are arranged in a second direction intersecting with the first direction; and a light reflection sheet bridging between the first solar cell and the second solar cell across the gap, the light reflection sheet comprising a resin base member and a light reflection film provided on a back side of the resin base member, the back side being opposite to a light receiving side;

front and back protective members, wherein the first to third solar cells and the light reflection sheet are provided between the front and back protective members;

front-side and back-side bonding members sealing the first to third solar cells and the light reflection sheet between the front and back protective members, such that in an area corresponding to the gap, the back protective member, the back-side bonding member, the light reflection sheet, and the front-side bonding member are provided in the recited order, wherein each of the first solar cell, the second solar cell, and the third solar cell comprises finger electrodes on a back surface thereof, each of the finger electrodes extending in the first direction, the resin base member is bonded to both the back surface and a side surface of each of the first solar cell and the second solar cell, the light reflection film is electrically insulated from the first solar cell and the second solar cell by the resin base member interposed between the light reflection film and the back surfaces of the first and second solar cells in a thickness direction of the solar cells, one end of the light reflection sheet in the first direction is provided on the back surface of the first solar cell such that an end surface of the one end of the light reflection sheet in the first direction is spaced apart from and faces an end surface of the finger electrode of the first solar cell, the other end of the light reflection sheet in the first direction is provided on the back surface of the second solar cell such that an end surface of the other end of the light reflection sheet in the first direction is spaced apart from and faces an end surface of the finger electrode of the second solar cell, the light reflection film has an uneven shape including concave and convex parts such that the uneven shape of the light reflection film is provided in the area corresponding to the gap and in areas corresponding to the back surfaces of the first and second solar cells, a portion of the light reflection sheet corresponding to the gap is at least partially curved in a single arcuate shape, as seen in a cross-section of the light reflection sheet, the back-side bonding member is in direct contact with the back protective member and is in direct contact with the concave parts of the light reflection film which is recessed toward the front-side bonding member, and in a plan view of the solar cell module, the back-side bonding member is overlapped with the light reflection sheet and the first and second solar cells.

12. The solar cell module according to claim 11, wherein in the curved portion, a light receiving surface of the light reflection sheet enters into the gap beyond an extension of the back surface of the first solar cell to which the light reflection sheet is attached.

13. The solar cell module according to claim 12, wherein in the curved portion, a back surface of the light reflection sheet also enters into the gap beyond the extension of the back surface of the first solar cell.

14. The solar cell module according to claim 11, wherein the portion of the light reflection sheet corresponding to the gap is entirely curved.

15. The solar cell module according to claim 11, wherein the light reflection sheet comprises light reflection members connected to one another.

16. The solar cell module according to claim 11, wherein the light reflection sheet further includes an adhesive on a front surface of the resin base member such that the resin base member of the light reflection sheet is bonded to the first solar cell and the second solar cell with the adhesive, and
a thickness of the light reflection sheet in a first portion lateral to an end of the first solar cell is larger than that in a second portion at a center position between the first solar cell and the second solar cell.

17. The solar cell module according to claim 16, wherein a thickness of the adhesive at a corner of the end of the first solar cell is smaller than that in the second portion.

18. The solar cell module according to claim 11, further comprising a wiring member electrically connecting the first solar cell with the third solar cell, wherein
the wiring member and the light reflection sheet are not overlapped with each other.

19. The solar cell module according to claim 11, wherein a height between the concave and convex parts of the uneven shape of the light reflection film is smaller than a height of the curve of the curved portion of the light reflection sheet.

20. The solar cell module according to claim 11, wherein the portion of the light reflection sheet corresponding to the gap includes only one maximum point as a highest point in the gap, as seen in the cross-section of the light reflection sheet.

21. The solar cell module according to claim 1, wherein the front-side bonding member is formed of ethylene-vinyl acetate (EVA) or polyolefin.

22. The solar cell module according to claim 1, wherein the front-side bonding member is formed of ethylene-vinyl acetate (EVA) or polyolefin; and
the front protective member is formed of a glass substrate.

23. The solar cell module according to claim 22, wherein the light reflection film is formed of metal.

* * * * *